(12) United States Patent
Marx et al.

(10) Patent No.: US 7,069,357 B2
(45) Date of Patent: Jun. 27, 2006

(54) TOUCH SENSOR SYSTEM

(75) Inventors: Elliot Marx, Yorba Linda, CA (US); John E. O'Donnell, Barrington, RI (US)

(73) Assignee: Numark Industries, LLC, Cumberland, RI (US)

( * ) Notice: Subject to any disclaimer, the term of this patent is extended or adjusted under 35 U.S.C. 154(b) by 298 days.

(21) Appl. No.: 10/765,783

(22) Filed: Jan. 27, 2004

(65) Prior Publication Data

US 2004/0215853 A1  Oct. 28, 2004

Related U.S. Application Data

(60) Provisional application No. 60/443,332, filed on Jan. 29, 2003.

(51) Int. Cl.
G06F 3/00 (2006.01)
G06F 15/00 (2006.01)

(52) U.S. Cl. .................. 710/73; 345/173; 345/178; 178/18.06; 341/33

(58) Field of Classification Search ............ 710/69–73; 178/18.01–18.06; 345/156–179; 307/116; 341/33
See application file for complete search history.

(56) References Cited

U.S. PATENT DOCUMENTS

| 4,581,483 A | * | 4/1986 | Ralston | 178/20.01 |
|---|---|---|---|---|
| 4,816,698 A | * | 3/1989 | Hook | 307/116 |
| 5,404,458 A | * | 4/1995 | Zetts | 710/73 |
| 5,650,597 A | * | 7/1997 | Redmayne | 178/18.06 |
| 5,801,340 A | * | 9/1998 | Peter | 178/20.04 |
| 5,875,311 A | * | 2/1999 | Bertram et al. | 710/305 |
| 6,753,853 B1 | * | 6/2004 | Dotson | 345/173 |
| 2002/0036621 A1 | * | 3/2002 | Liu et al. | 345/173 |
| 2006/0022959 A1 | * | 2/2006 | Geaghan | 345/173 |

* cited by examiner

*Primary Examiner*—Christopher Shin
(74) *Attorney, Agent, or Firm*—Barlow, Josephs & Holmes, Ltd.

(57) ABSTRACT

A touch sensor system and a method of operating the system is provided to detect the touch of a person. An AC power source is provided with an isolated power supply connected to thereto with a DC voltage source output. The DC voltage source is referenced to ground. An impedance limiting circuit is connected to the output of the DC voltage source. An analog-to-digital converter is connected to the impedance limiting circuit. A processor is connected to the analog-to-digital converter with the touch sensor connected to the impedance limiting circuit. The touch sensor is capacitively coupled to the AC power source. The waveform output of touch sensor is monitored and with the waveform output as an OFF reference waveform when the touch sensor is not being touched and the waveform output is stable being calculated and saved. The lack of contact with the touch sensor by the body part is indicated by the system when the waveform output is less than 2 times the OFF reference waveform and contact of the touch sensor by the body part is indicated when the waveform output is more than 2 times the OFF reference waveform.

13 Claims, 3 Drawing Sheets

TOUCH SENSOR SYSTEM

CROSS REFERENCE TO RELATED APPLICATIONS

This application is related to and claims priority from earlier filed provisional patent application No. 60/443,332, filed Jan. 29, 2003.

BACKGROUND OF THE INVENTION

The present invention relates generally to electronic switches and controls. More specifically, the present invention relates to an electronic interface for controlling the sound of an audio device, such as a CD player.

It is well known in the prior art that such sensors are, essentially, simple electronic sensors that are on the principle of capacitive coupling of an AC voltage source through the human body. Since the human body has a large surface area compared to most electronic buttons and sensors, it will have a larger capacitive coupling to the voltage source than the sensor itself. When a person touches the sensor, such as by a finger, the net result is that the voltage signal on the sensor is increased due to the better capacitive coupling.

This technology is applicable to devices which are plugged into a mains AC source. In America, the standard is 120 VAC and the frequency is 60 Hz. In many locations this standard can be different. Some locations may have higher or lower AC voltages and may hove higher or lower frequencies. In the context of touch sensors, it is assumed that such an AC source may vary between, for example, about 90 VAC and about 264 VAC worldwide and between about 47 Hz and about 63 Hz in frequency. It should be understood that these are just examples of voltages and frequencies that can accommodate a touch sensor and that other ranges of voltages and frequencies can be used.

In the prior art, the operability of touch sensor technology depends very heavily on a controlled environment with known parameters. In such an environment, it is very simple to build a sensor that can determine if someone has touched it. An example of such a controlled environment is as follows:

1) No other nearby devices or wiring will add or subtract significantly to the AC voltage coupled to the person who touches the sensor or the sensor itself;
2) The device itself emits a known AC mains signal;
3) The device is always installed in the same type of location; and
4) It is not possible for the person to ground his/her body.

An example of a such a device that would meet these criteria is an automatic teller machine. The device is stand-alone and there are no other nearby devices. The device will always have roughly the same AC mains signal emitted as long as it is mass produced. The installer of the device most likely will ensure that the locations always have similar wiring. The device is made of plastic so a person can't ground his body.

As can be understood, such a controlled environment cannot always be achieved and, therefore, restricts the installation options for the touch sensor.

This is a significant drawback for known touch sensor devices. For example, a useful environment and application for a touch sensor is consumer electronic equipments, such a stereo equipment and disc jockey ("DJ") equipment. DJ equipment, an ideal environment for use of touch sensors, is particularly problematic because the equipments is frequently moved from location to location and is subject to vastly differing environments with different voltage supplies, different levels of static electricity, for example. As a result, use of a touch sensor in DJ equipment is not practical because there are too many variables and performance of the touch sensor will be inferior and, therefore undesirable.

Many attempts have been made in the prior art to address the shortcomings of known touch sensors when used in DJ equipment and other electronics. For example, the equipment has been placed on a metal surface for the purposes of attempting to shield the signal from AC sources. If the equipment with the touch sensor is placed in a high static environment, often the DJ will pick up a static signal which is far greater than the AC source pickup resulting in erratic touch sensor performance. Also, it is common for such equipment to be placed next to a mixer which results in the DJ frequently grounding his/her body through the mixer when working with a CD player and mixer together which again makes use of a touch sensor very difficult. Furthermore, the use of equipment in many places through the world, each with different AC mains grounding and different proximity to AC power sources, makes it very difficult to achieve satisfactory touch sensor performance.

Therefore, in view of the concerns discussed above, it would be desirable for a touch sensor that has high performance regardless of the operating environment. It is also desirable for a touch sensor to be resistance to environmental static electricity and still perform as desired. Further, is also desirable for a touch sensor to be resistant to periodic grounding by the user. It is further desirable for the touch sensor that can perform as desired even when placed close to an AC source.

SUMMARY OF THE INVENTION

The present invention preserves the advantages of prior art touch sensors. In addition, this touch sensor provides new advantages not found in prior art touch sensors, and overcomes many of the disadvantages of such touch sensors.

The invention is generally directed to a novel and unique touch sensor system and method for operating the same. The touch sensor system of the present invention enables a touch sensor control device to be used in a wide array of environmental conditions. The touch sensor system of the present invention has particular application in providing a touch sensor control in DJ equipment which is typically operated in different environments where certain parameters, such as voltage and static level, cannot be precisely controlled.

The preferred embodiment of the touch sensor system of the present invention includes The touch sensor system and a method of operating the system is provided to detect the touch of a person. An AC power source is provided with an isolated power supply connected to thereto with a DC voltage source output. The DC voltage source is referenced to ground. An impedance limiting circuit is connected to the output of the DC voltage source. An analog-to-digital converter is connected to the impedance limiting circuit. A processor is connected to the analog-to-digital converter with the touch sensor connected to the impedance limiting circuit. The touch sensor is capacitively coupled to the AC power source. The waveform output of touch sensor is monitored and with the waveform output as an OFF reference waveform when the touch sensor is not being touched and the waveform output is stable being calculated and saved. The lack of contact with the touch sensor by the body part is indicated by the system when the waveform output is less than 2 times the OFF reference waveform and contact of the touch sensor by the body part is indicated when the waveform output is more than 2 times the OFF reference waveform.

The method of operating the touch sensor system of the present invention includes the calculating and saving of an OFF reference waveform when the touch sensor is not being touched as well as an ON reference waveform when the touch sensor plate is being touched. These references are employed by the method of the present invention to compensate for the effects of static electricity, changes in environmental voltage and grounding to ensure that the touch sensor system operates effectively.

In use, the touch sensor system can be incorporated into a wider range of equipment and devices that was previously achievable with prior art touch sensor systems. The touch sensor systems, such as in DJ equipment, can be used to control virtually any type of parameter of the music, such as volume, fading, scratching, and the like.

It is therefore an object of the present invention to provide a touch sensor system and method that is greatly improved over prior art touch sensor systems and associated methods.

An additional object of the present invention is to provide a touch sensor system and method that can be installed as a controller in electronic equipment.

Another object of the present invention is to provide a touch sensor system and method that greatly reduces, if not eliminates, the effect of static electricity on the performance of a touch sensor control.

It is another object of the present invention to provide a touch sensor system and method that greatly reduces, if not eliminates, the effect of changes in the AC source on the performance of a touch sensor control.

It is a further object of the present invention to provide a touch sensor system and method that greatly reduces, if not eliminates, the effect of grounding by the user on the performance of a touch sensor control.

It is yet a further object of the present invention to provide a touch sensor system and method that can operate effectively in a wide range of operating environments.

It is another object of the present invention to provide a touch sensor system and method that is more reliable than prior art touch sensor systems.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

DETAILED DESCRIPTION OF THE PREFERRED EMBODIMENT

The touch sensor of the present invention address and solves all of the known foregoing problems associated with prior art touch sensors in the industry in a very methodical and efficient manner.

Figure 1:
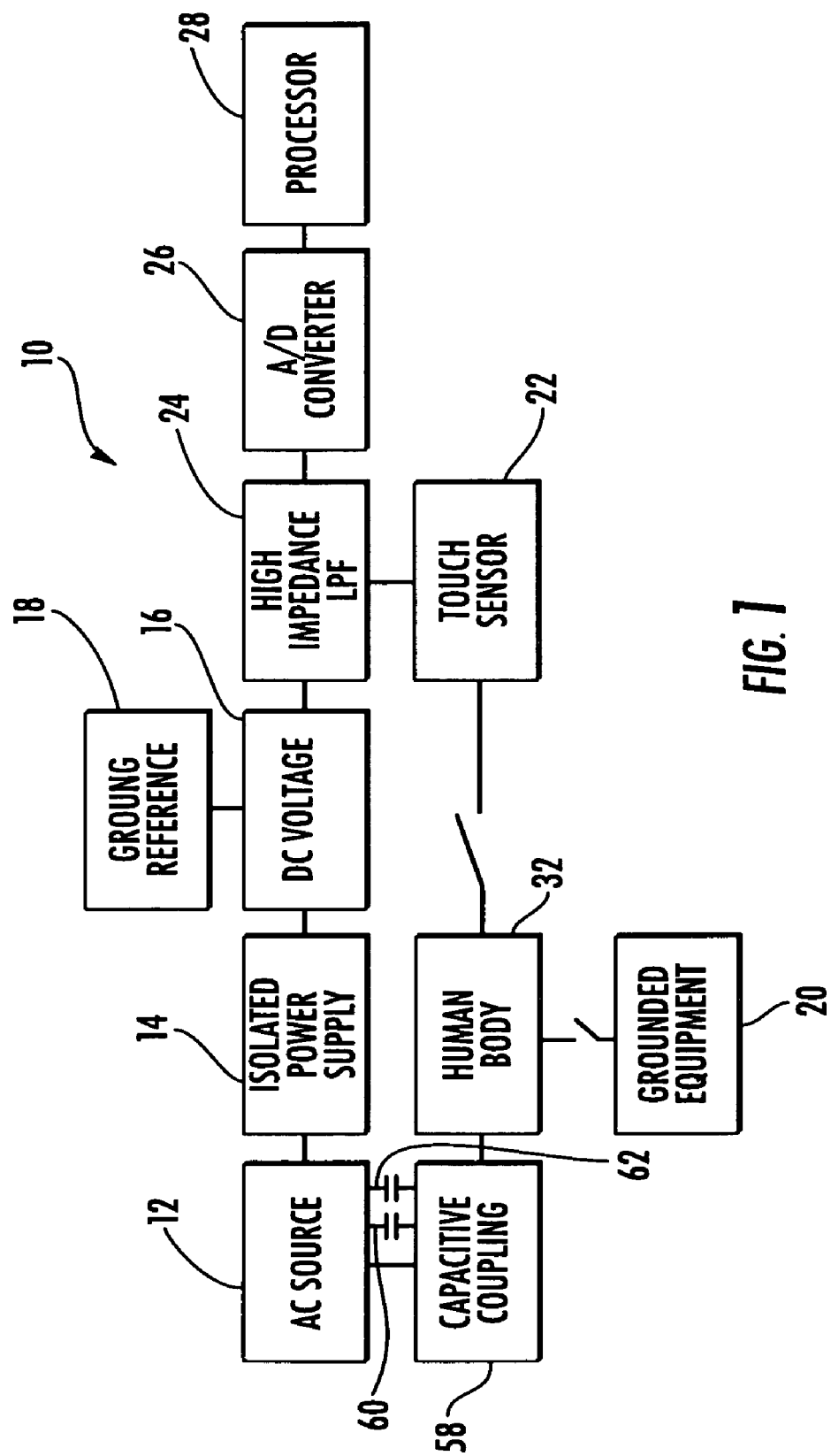
FIG. 1 is a schematic block diagram of the touch sensor of the present invention.

Referring first to FIG. 1, a schematic block diagram of the touch sensor system 10 the present invention is show. The system employs an AC power voltage source 12 which provides electrical power through a power supply 14, such as an isolated power supply, to provides a DC voltage 16. The DC voltage 16 is preferably referenced to ground 18. The ground 18 ideally is connected to the ground from the voltage source 12 or grounded equipment 20.

The touch sensor system of the present invention includes a conductive material sensor plate 22 which is connected through a high impedance circuit 24 and referenced to a DC voltage 16. The conductive material sensor plate 22 is preferably conductive carbon but may be made of other materials that are suitable for conducting electricity. The DC voltage reference 16 allows the touch sensor plate 22 to detect a body part, such as a finger of a user, touching the sensor plate 22 while also touching grounded equipment 20. The impedance 24 is selected to be high enough to limit the current which could possibly cause an unpleasant touch sensation. For example, the impedance is preferably set to 1 Megohm but could be other levels of impedance depending on the application and environment of operation. In addition, the high impedance is necessary to guarantee that the incoming signal is not significantly reduced.

Still referring to FIG. 1, the high impedance circuit 24 also, preferably, has built into it a low pass filter (LPF) which is designed to allow pass-through of about 47–63 Hz signals from the AC power voltage source 12 but filter signal of higher frequencies. This filtering by the high impedance circuit 24 is essential because higher frequency signals have much better capacitive coupling than lower frequency signals. As a result, the LPF ensures that high frequency signals emitted by other electronic components are eliminated.

The filtered output of the LPF is passed through an analog to digital converter 26. In the preferred embodiment, this is preferably a voltage controlled oscillator but may be other devices, such as a standard A/D converter which is also acceptable. The digital output of the A/D converter 26 is then fed to processor 28 for interpretation and processing of the data. From this processed data, it is determined, with accuracy and reliability, whether or not a person is touching the touch sensor plate 22.

Figure 2:
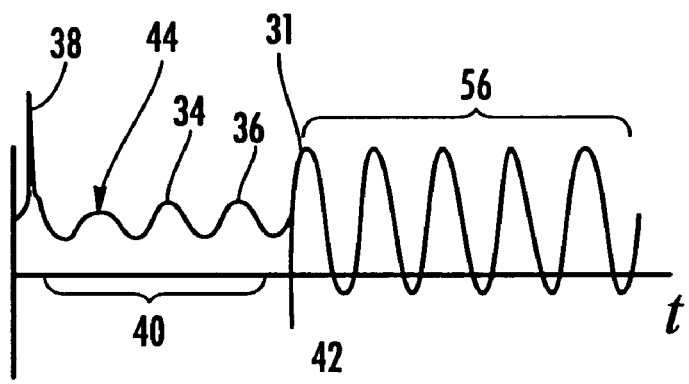
FIG. 2 is a graph of the waveform through the touch sensor of FIG. 1 showing a static discharge, a reference OFF waveform and a reference ON waveform.

More specifically, the processor 28 performs many functions on the digital information received from the A/D converter 26. Details of the processing of waveform signal data by processor 28 is illustrated in FIGS. 2–6. Referring next to FIG. 2, a graph of the waveform received by the processor is shown. The waveform is generally divided into three sections, namely, a static discharge section 38, an non-contact section 30 and a contact section 31. To optimize performance of the touch sensor system, the processor 28 first identifies a fundamental frequency on the signal 30 picked up by touch sensor plate 22 without contact by the human body 32. This fundamental frequency is the same whether or not somebody touches the sensor because this is simply the AC power source 12 frequency, which is approximately 47–63 Hz. The processor 28 executes an auto-correlation between adjacent data segments 34 and 36 of waveform section 30 to find a fundamental frequency within this range. In addition, the processor 28 will only do this if it finds a voltage waveform which has a stable amplitude and frequency so that transients from static discharge, represented by waveform section 38, do not affect this fundamental frequency calculation.

Starting from power-on of the touch sensor system 10, the processor 28 continuously computes an OFF reference AC voltage 40. The processor 28 only computes this reference AC voltage 40 while it determines that the sensor plate 22 is not being touched. For simplicity, the processor 28 will always assume that sensor plate 22 is not being touched on power up of the system 10.

Figure 3:
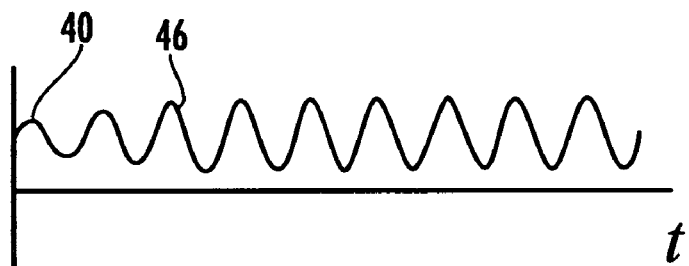
FIG. 3 is a graph of the waveform through the touch sensor of FIG. 1 showing a gradual change in AC pickup when the sensor is not being touched.
Figure 4:
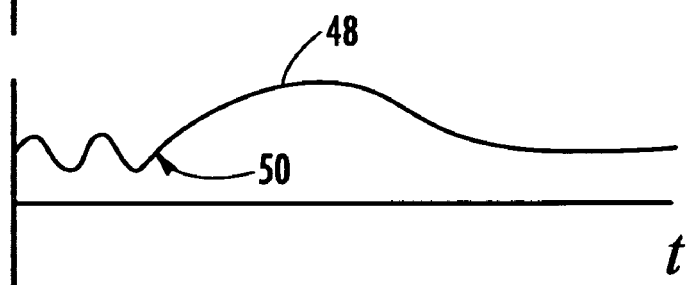
FIG. 4 is a graph of the waveform through the touch sensor of FIG. 1 showing an electrical static charge buildup thought the touch sensor.

The touch sensor system and associated method of operation of the present invention uniquely operates to compensate for changes in AC voltage. As seen in FIG. 3, the processor 28 continually computes the OFF reference AC voltage 40 to adjust for gradual changes in the AC pickup on the sensor plate 22. For example, the OFF AC reference voltage 40 increases slightly at point 46. As a result, the OFF AC reference voltage 40 is re-adjusted accordingly and saved by the processor. Such changes in the OFF AC reference voltage 40 commonly occurs if the body part 32 gets closer and then farther away from the touch sensor plate 22. In addition, the OFF reference voltage 40 is always saved by the processor 28, the use of which will be described in detail below.

Referring back to FIG. 2, when a body part 32 touches the sensor plate 22, the AC voltage signal 30 on the sensor plate 22 increases dramatically at 42. The processor 28 interprets the rapid increase in voltage to waveform 31 as a body part 32 of a user touching the sensor plate 22. This increase to waveform 31 is specifically the increase over the stable AC reference voltage 30. This assists in elimination of problems that occur if static 38 or other voltage sources, such as from device turn on and turn off, temporarily cut out the AC voltage signal 44.

The touch sensor system of the present invention also compensates for when someone touches the sensor plate 22 and the DC voltage level changes dramatically. This is shown in connection with FIG. 3. This can occur either because the user's body becomes electrically charged with static 48 or because the a body part 32 has touched a grounded piece of equipment or device 20 at point 50. Such a DC level change is interpreted to be a sensor touch to plate 22. The threshold for determining a DC change is that it is high enough to prevent signal noise from triggering it and low enough so that a person who is well grounded will greatly reduce or eliminate the incoming AC signal 44.

One problem with this is that there are many situations which can create sudden increases in AC voltage 44. For example, one situation is when a nearby device is turned on. So, as a result, the touch sensor system 10 must only activate if the voltage level 44 increase is large enough. Nearby devices turning on will typically increase the AC pickup by 50%. However, a person touching the sensor plate 22 will increase the signal pickup by a factor of 4 in the preferred embodiment. These numbers will increase with increased surface area of the sensor plate 22 so it is critical these numbers are adjusted as such. These numbers are based on a flat metal plate sensor 22 approximately 4 inches in diameter which is made of conductive carbon, for example.

This is resolved simply by arbitrarily determining that a sudden change of voltage by more than 3 times is interpreted as a body part actually touching the sensor as shown from point 36 to point 31 in FIG. 1.

Figure 5:
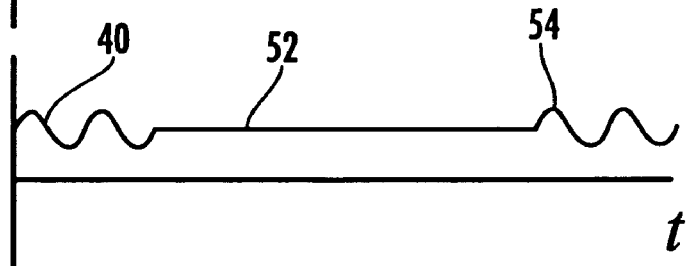
FIG. 5 is a graph of the waveform through the touch sensor of FIG. 1 showing when a user is holding a hand over the sensor without touching it and then touching a grounded object.

FIG. 5 illustrates another situation when a body part, such as a hand, is held over the sensor plate 22 without touching it and then touching a grounded object at point 52. In this situation, releasing the other hand of body part 32 from the grounded equipment 20 will also create an increase in AC peak to peak voltage by more than 3 times from 52 to 54. Processor 28 address this situation by remembering the AC voltage from the sensor plate 22 at position 31 of FIG. 1, known as the ON reference AC voltage 56. If the sudden increase in voltage is still less than 1/10th of the ON reference AC voltage 56, then the processor 28 knows that the signal 44 in the present environment is still too small to be interpreted as a sensor touch to plate 22. This also allows for tolerance due to the environmental AC signal changing slightly.

Normally there is enough capacitive coupling 58 in the sensor environment that this touch sensor system 10 will typically work with no problems. One practical problem with the sensor implementation is that in some environments, there is little or no AC signal for getting picked up by the sensor. This is resolved by ensuring that the product itself incorporating the sensor emits its own AC signal from the mains AC source 12. This is done by using two Y-capacitors 60, 62 in the capacitive coupling 58. One connects from the AC line input to a metal plate 22 and the other connects from the AC line neutral to a metal plate 22. This plate 22 is oriented to maximize the surface area which can couple to a person standing in front of the sensor system 10. It is also placed to minimize direct coupling to the sensor itself to maintain a large difference between contact and non-contact voltage levels.

The Y-capacitors 60, 62 are sized so that they are much larger than the capacitive coupling 58 from the metal plate 22 to the person standing near the sensor. Since the latter is only a few picofarads, using Y-capacitors 60, 62 of about 330 pF are adequate for this purpose. It is desirable to keep these capacitors 60, 62 small for safety reasons; if the metal plate 22 shorts to a grounded object, the current is limited to a very safe level of under 0.1 mA.

Static has many unusual effects in conjunction with the operating of the system of the present invention. For example, the signal pickup from the sensor 22 can change dramatically when a person walks on a carpet while holding the touch sensor 10 as in 48 in FIG. 4. As a result, the processor only computes an ON reference AC voltage 56 when the AC signal is stable as shown at point 13. The signal at point 48 is actually a very low frequency signal. The problem is that it cannot be filtered out because the frequency can often temporarily fall very close to the 47–63 Hz main AC voltage. But typically the static signal isn't constant frequency so waiting for an AC signal which has a stable frequency and magnitude solves this problem as what can be carried out with the present invention.

Another interesting static effect is that there may be a single or even multiple static discharges 38, as seen in FIG. 2, which will cause extremely large and sudden voltages that might get picked up by the system 10. Since the processor 28 has already determined a fundamental frequency 40 of the signal 44 as shown above, the processor 28 simply does a cycle-to-cycle comparison of the AC signal 44. The processor 28 first doubles the single cycle data from the previous AC voltage cycle going into the processor 28. If more than half of the samples of the current AC voltage cycle exceed the doubled previous cycle magnitude, then the change in voltage is determined to be a sensor touch. If it is less, than the voltage change is ignored and the processor 28 doesn't mistake the static signal for a sensor touch.

The release of the sensor 22 depends on the signal received by the processor 28 being less than ⅓ of the off reference voltage computed at 14 and 15. Having the OFF reference voltage 40 ensures that the processor 28 hasn't inadvertently used a transient for the OFF reference voltage 40 or even worse, the off reference was changed by a static discharge.

Figure 6:
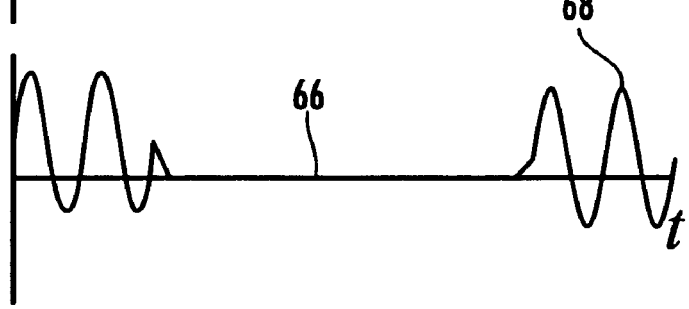
FIG. 6 is a graph of the waveform through the touch sensor of FIG. 1 showing when a user touches and releases a hand from a grounded source while touching the sensor.

The OFF reference voltage 40 from point 34 to point 36 has another use which is illustrated in FIG. 6. There may be a situation where a person touches the touch sensor plate 22 at point 66 and then releases the plate 22 at point 68 with a body part 32 from a grounded source 20 while touching the sensor plate 22. In this case, when the DC level disappears, the processor 28 looks to see if the remaining AC level 68 is more or less than ⅓ of the OFF reference voltage 40 from point 34 to point 36. If a body part 32 of a user is still touching the sensor plate 22 then the voltage will be higher and the processor 28 will correctly determine that someone is still touching the sensor plate 22. If the voltage is lower, then the processor 28 will correctly determine that the person touching the sensor has stopped touching the sensor.

Figure 7:
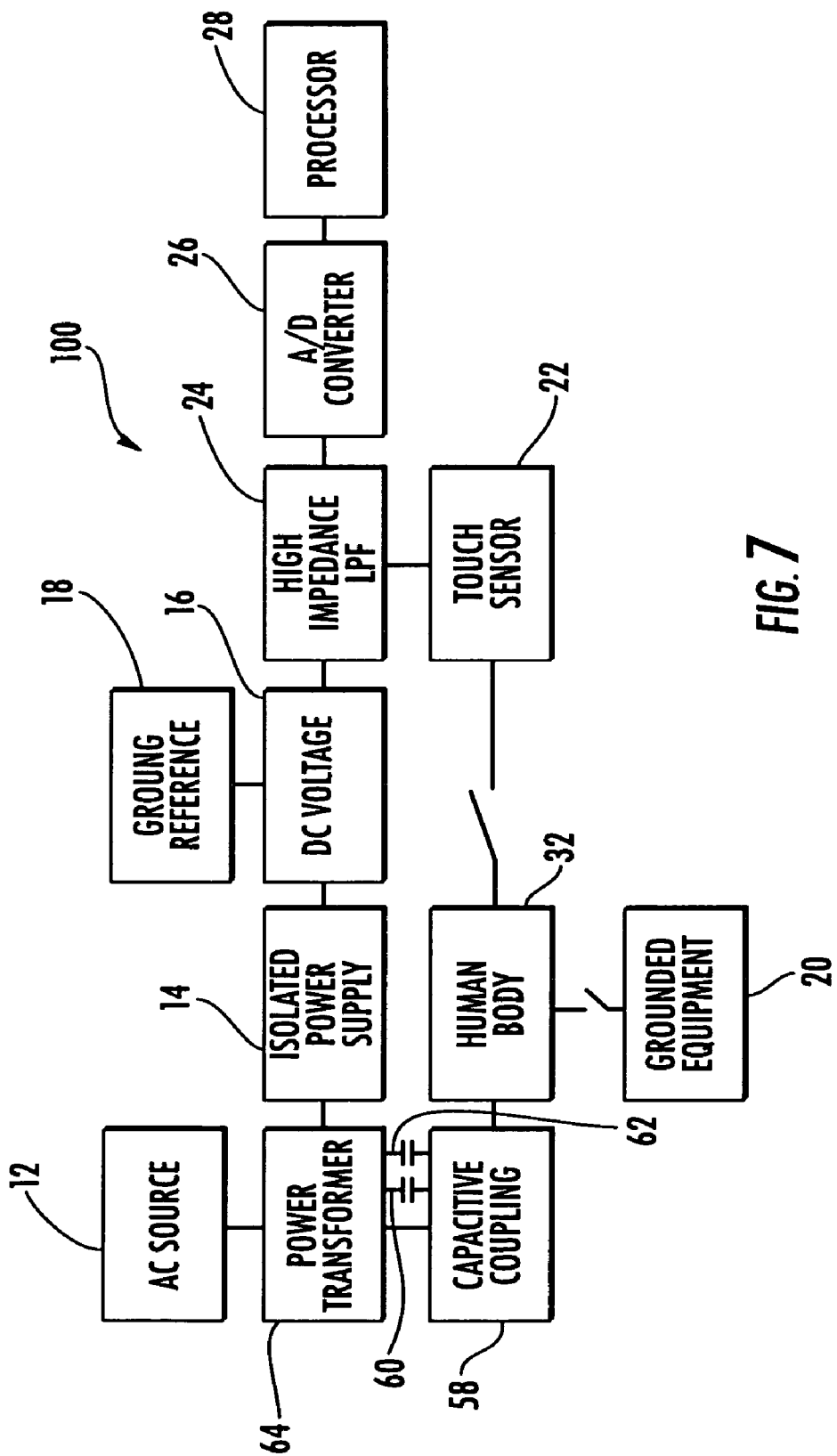
FIG. 7 is a schematic block diagram of an alternative embodiment of the touch sensor of the present invention.

In the alternative embodiment 100 of FIG. 7, the AC line input 1 is replaced by an AC input 1 of source 12 which can be doubled by a power transformer 64 used to power the device 10. In this application, the AC line input goes to the transformer center tap and the doubled voltage tap is used.

This doubled voltage tap is commonly available on transformers designed for use in either 110–120V or 220–240V countries.

In accordance with the present invention, it is assumed that such an AC source may vary between about 90 VAC and about 264 VAC worldwide and between about 47 Hz and about 63 Hz in frequency but the voltage or frequency can be different without changing the scope of the invention.

It can be understood that various devices, circuits and materials can be employed to carry out the touch sensor system 10 of the present invention. For example, the materials of the sensor plate 22 itself may be altered and the type and range of LPF can be modified to suit the application and environment at hand. Thus, the invention includes the unique and novel processing of the signal from the A/D converter 26 to determine when the touch sensor plate 22 has been touched or not so that it can be effectively used as a controller for a piece of electronic equipment.

In view of the foregoing, an enhanced interface that employs a touch-sensitive scratch wheel, with high response, can be incorporated into a CD player. As a result, unprecedented realism in digital mixing and scratching can be achieved while simultaneously using an array of effect.

It will be appreciated by those skilled in the art that various changes and modifications can be made to the illustrated embodiments without departing from the spirit of the present invention. All such modifications and changes are intended to be covered by the appended claims.

What is claimed is:

1. A method of sensing a touch, comprising the steps of:
providing an AC power source having a line input and a line neutral;
providing an isolated power supply connected to the AC power source and having a DC voltage source output;
referencing the DC voltage source reference to ground;
connecting an impedance limiting circuit to the output of the DC voltage source;
connecting an analog-to-digital converter to the impedance limiting circuit; the analog-to-digital converter having a waveform output;
connecting a processor to the analog-to-digital converter;
connecting a touch sensor to the impedance limiting circuit; the touch sensor capable of being touched by a body part;
capacitively coupling the touch sensor to the AC power source;
monitoring the waveform output with the processor;
calculating and saving the waveform output as an OFF reference waveform when the touch sensor is not being touched and the waveform output is stable;
indicating lack of contact with the touch sensor by the body part when the waveform output is less than 2 times the OFF reference waveform; and
indicating contact of the touch sensor by the body part when the waveform output is more than 2 times the OFF reference waveform.

2. The method of claim 1, further comprising the steps of:
calculating and saving the waveform output as an ON reference waveform when the touch sensor is being touched and the waveform output is stable;
indicating lack of contact with the touch sensor by the body part when the waveform output is less than $\frac{1}{10}^{th}$ of the ON reference waveform.

3. The method of claim 1, further comprising:
indicating lack of contact with the touch sensor by the body part when the waveform output is less than 3 times the OFF reference waveform; and
indicating contact of the touch sensor by the body part when the waveform output is more than 3 times the OFF reference waveform.

4. The method of claim 1, wherein the step of capacitively coupling the touch sensor to an input of the AC power source includes connecting a first capacitor between the line input of the AC power source and a metal plate and connecting a second capacitor between the line neutral to the metal plate.

5. The method of claim 4, wherein the first capacitor and the second capacitor are of the Y-type and each about 330 pF.

6. The method of claim 1, further comprising the step of:
indicating when a body part has stopped touching the touch sensor when the waveform output is less than ⅓ of the OFF reference waveform.

7. The method claim 1, wherein the AC power source is between about 90 and 264 AC volts.

8. The method of claim 1, wherein the frequency of the AC power source is between about 47 and 63 Hz.

9. The method of claim 1, wherein the analog-to-digital converter is a voltage controlled oscillator.

10. The method of claim 1, wherein the step of saving the waveform output as an OFF reference waveform includes the step of auto-correlating adjacent data segments in the waveform output.

11. The method of claim 1, further comprising the step of:
continuously calculating and saving the OFF reference waveform when the touch sensor is not being touched by the body part.

12. The method of claim 1, further comprising the step of:
providing a power transformer; and
doubling the line input of the AC power source with the power transformer.

13. The method of claim 1, wherein the step of detecting a stable fundamental frequency waveform when the touch sensor is not being touched is carried out upon powering on the power supply.

* * * * *